US008356271B2

(12) United States Patent
Kim et al.

(10) Patent No.: US 8,356,271 B2
(45) Date of Patent: Jan. 15, 2013

(54) LAYOUT TESTING METHOD AND WAFER MANUFACTURING METHOD

(75) Inventors: Daewook Kim, Hwaseong-si (KR); Yong Hee Park, Seoul (KR); Ji-Seong Doh, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 15 days.

(21) Appl. No.: 13/050,276

(22) Filed: Mar. 17, 2011

(65) Prior Publication Data

US 2011/0237005 A1  Sep. 29, 2011

(30) Foreign Application Priority Data

Mar. 23, 2010  (KR) ........................ 10-2010-0025907

(51) Int. Cl.
*G06F 17/50*  (2006.01)
(52) U.S. Cl. ........................ 716/136; 716/111
(58) Field of Classification Search .................. 716/111, 716/112, 113, 136
See application file for complete search history.

(56) References Cited

U.S. PATENT DOCUMENTS

2008/0295049 A1* 11/2008 Izuha ................................ 716/5
2009/0037852 A1* 2/2009 Kobayashi et al. ............... 716/2

FOREIGN PATENT DOCUMENTS

| JP | 2007-133498 | 5/2007 |
| JP | 2009-032199 | 2/2009 |
| KR | 100567069 | 3/2006 |
| KR | 1020080080881 | 9/2008 |

OTHER PUBLICATIONS

English Abstract for Publication No. 100567069.
English Abstract for Publication No. 2007-133498.
English Abstract for Publication No. 1020080080881.
English Abstract for Publication No. 2009-032199.

* cited by examiner

*Primary Examiner* — Vuthe Siek
(74) *Attorney, Agent, or Firm* — F. Chau & Associates, LLC (57) ABSTRACT

A product layout testing method includes testing and correcting one or more patterns of a product layout, detecting and correcting electrical characteristic changes of transistors of the product layout, and testing whether a product characteristic predicted from the product layout is equal to that predicted from a designed circuit view. Weak points with respect to the pattern may be detected and corrected, electrical characteristic changes depending on layout parameters may be detected and corrected, and whether a circuit operation depending on parasitic components is normal may be checked.

20 Claims, 10 Drawing Sheets

$$\Delta Ei = \Sigma \Delta Pi \times \delta El / \delta Pi \Longrightarrow \begin{cases} \Delta Id = f(p1, p2, p3 \ldots) \\ \Delta Vth = f(p1, p2, p3 \ldots) \\ \Delta Ioff = f(p1, p2, p3 \ldots) \end{cases}$$

Fig. 9

| | GP2DC | DC share rate | SA/SB | WPE | Finger type | Effective length | Effective width | Power line resistance |
|---|---|---|---|---|---|---|---|---|
| M1 | 0.085 | 73% | 0.2 | 2.4 | (S)Share (D)Iso | 0.01 | 1.2 | 300 |

Fig. 10

|    | Id  | Ioff | Vth | Cov |
|----|-----|------|-----|-----|
| M1 | 97% | 150% | 85% | 80% |

LAYOUT TESTING METHOD AND WAFER MANUFACTURING METHOD

CROSS-REFERENCE TO RELATED APPLICATIONS

This U.S. non-provisional patent application claims priority under 35 U.S.C. §119 from Korean Patent Application No. 10-2010-0025907, filed on Mar. 23, 2010, the contents of which are herein incorporated by reference in their entirety.

BACKGROUND

The present disclosure is directed to a layout testing method and a wafer manufacturing method.

As semiconductor devices are reduced in size, the relative rate of process changes that occur during the manufacture of the semiconductor device increases. That is, process errors increase in a semiconductor integrated circuit as the degree of integration increases. As a result, the design of a semiconductor integrated circuit needs to consider the effects of process changes. In particular, since process changes affect the manufacturing yield of a semiconductor device, it is useful to predict, in the design stage, how electrical characteristics of the product will change based on process changes.

The design of a semiconductor device may be checked by Layout Versus Schematic verification. Layout Versus Schematic (LVS) is a class of electronic design automation (EDA) verification software that determines whether a particular integrated circuit layout corresponds to the original schematic or circuit diagram of the design. LVS checking software recognizes the drawn shapes of the layout that represent the electrical components of the circuit, as well as the connections between them. These drawn shapes of the layout may be referred to as a circuit view. This netlist is compared by the LVS software against a similar schematic or circuit diagram's netlist.

LVS checking involves following three steps:
1. Extraction: The software program imports a database file containing all the layers drawn to represent the circuit during layout, and runs the database through logic operations to determine the semiconductor components represented in the drawing by their layers of construction. It then examines the various drawn metal layers and to determine how each of these components connects to the others.
2. Reduction: The software combines the extracted components into series and parallel combinations if possible and generates a netlist representation of the layout database. A similar reduction is performed on the "source" Schematic netlist.
3. Comparison: The extracted layout netlist is then compared to the netlist taken from the circuit schematic. If the two netlists match, then the circuit passes the LVS check. At this point it is said to be "LVS clean". (Mathematically, the layout and schematic netlists are compared by performing a graph isomorphism check to see if the netlists are equivalent.)

In most cases the layout will not pass LVS the first time, requiring the layout engineer to examine the LVS software's reports and make changes to the layout. Typical errors encountered during LVS include:
1. Shorts: Two or more wires that should not be connected together have been and must be separated.
2. Opens: Wires or components that should be connected are left dangling or only partially connected. These must be connected properly to fix this.
3. Component Mismatches: Components of an incorrect type have been used (e.g. a low Vt MOS device instead of a standard Vt MOS device).
4. Missing Components: An expected component has been left out of the layout.
5. Parameter Mismatch: Components in the netlist can contain properties. The LVS software can be configured to compare these properties to a desired tolerance. If this tolerance is not met, then the LVS run is deemed to have a Property Error. A parameter that is checked may not be an exact match, but may still pass if the LVS software tolerance allows it. For example: if a resistor in a schematic had resistance=1000 (ohms) and the extracted netlist had a matched resistor with resistance=997 (ohms) and the tolerance was set to 2%, then this device parameter would pass as 997 is within 2% of 1000.

SUMMARY

The present disclosure provides a layout testing method and a wafer manufacturing method, which can detect electrical characteristic changes according to a layout mode.

Embodiments of the inventive concept provide layout testing methods including: detecting weak points of a designed product layout using a pattern simulator; correcting the weak points of the product layout; comparing layout parameters of the product layout with layout parameters of a test wafer to detect electrical characteristic changes of transistors of the product layout, wherein differences between the layout parameters of the product layout and the layout parameters of the test wafer are input into a circuit simulator to detect the electrical characteristic changes according to an electric characteristic change model expressed as functions of differences between the layout parameters of the product layout and the layout parameters of the test wafer; and correcting the product layout, if the detected electrical characteristic changes have values greater than predetermined threshold values.

In some embodiments, the layout testing methods may include extracting the layout parameters of the product layout, before comparing with the layout parameters of the test wafer.

In other embodiments, the extracted layout parameters may include at least one of a contact volume, a distance from a gate pattern to a contact, a contact share ratio, a diffusion length, a distance between separate active regions, a well proximity, a finger type, a gate pattern distortion, an active pattern distortion, and a power line resistance.

In other embodiments, the layout testing methods further include checking whether product characteristics predicted from the product layout are equal to those predicted from a designed circuit view; and performing a post layout simulation to check whether an operation of the designed circuit is normal.

In yet other embodiments, the layout testing methods may further include extracting parasitic components occurring due to pattern distortion before performing the post layout simulation.

In further embodiments, the extracted parasitic components may be projected onto the designed circuit view to perform the post layout simulation.

In still further embodiments, the layout testing methods may further include using model parameters in the post layout simulation, where the model parameters may include a channel length, a device width, a doping profile, an oxide thickness, an oxide permittivity, and a channel length modulation constant.

In still further embodiments, detecting weak points of the designed product layout may include using an optical proximity correction (OPC) technology to check and correct the patterns of the product layout.

In other embodiments of the inventive concept, wafer manufacturing methods include: manufacturing at least one test wafer, modeling electrical characteristic changes of a transistor's layout parameters of the at least one test wafer using an electrical characteristics model, and detecting a plurality of electrical characteristics of the at least one test wafer from the model parameters of the test wafer.

In other embodiments, the wafer manufacturing methods include: designing a product layout that satisfies a design rule; testing and correcting one or more patterns of the product layout; extracting layout parameters of each transistor of the product layout; comparing the extracted layout parameters with the layout parameters extracted from the test wafer to detect and correct electrical characteristic changes of whole transistors of the product layout; checking whether the corrected product layout is equivalent to that predicted from a designed circuit view; performing a post layout simulation using the layout parameters extracted from the test wafer; and manufacturing a wafer according to the corrected product layout.

In some embodiments, the wafer manufacturing methods further include extracting parasitic resistance and capacitance resulting from pattern distortion and projecting the extracted parasitic resistance and capacitance onto the designed circuit view before performing the post layout simulation.

In still other embodiments, the electrical characteristics model is used to compare the extracted layout parameters with the layout parameters extracted from the test wafer.

In even other embodiments, the testing and correcting of the one or more patterns may use an optical proximity correction (OPC) technology.

In further embodiments, manufacturing a wafer may further include manufacturing a mask pattern according to the corrected product layout.

In still other embodiments, the electrical characteristic model is one of a table, a regression equation, or a circuit simulation. When a difference between the layout parameters is above a predetermined value, the table lists the corresponding layout parameter corrections, the regression equation is a numerical formula for the correction of the layout parameters as a function of the difference between the layout parameters, and the circuit simulation calculates layout parameter corrections based on the differences between the layout parameters.

In still other embodiments of the inventive concept, layout testing methods include: checking whether a designed product layout satisfies a design rule; detecting and correcting electrical characteristic changes of product layout parameters of the designed product layout; checking whether product characteristics predicted from the product layout are equal to those predicted from a designed circuit view; and performing a post layout simulation with respect to the corrected product layout to check whether circuit operation is normal.

In some embodiments, the design rule may include widths, lengths, and pattern spacings or pattern overlaps.

In other embodiments, the detecting and correcting electrical characteristic changes may include checking electrical characteristic changes of transistors of the product layout.

In still other embodiments, when the electrical characteristic changes of the transistors of the product layout exceed predetermined values, the product layout may be corrected.

In even other embodiments, the post layout simulation may be performed by a circuit operation simulator according to an electrical characteristic change model using model parameters extracted from a test wafer.

DETAILED DESCRIPTION OF EXEMPLARY EMBODIMENTS

Exemplary embodiments of the inventive concept will be described below in more detail with reference to the accompanying drawings. The inventive concept may, however, be embodied in different forms and should not be construed as limited to the embodiments set forth herein.

Figure 1:
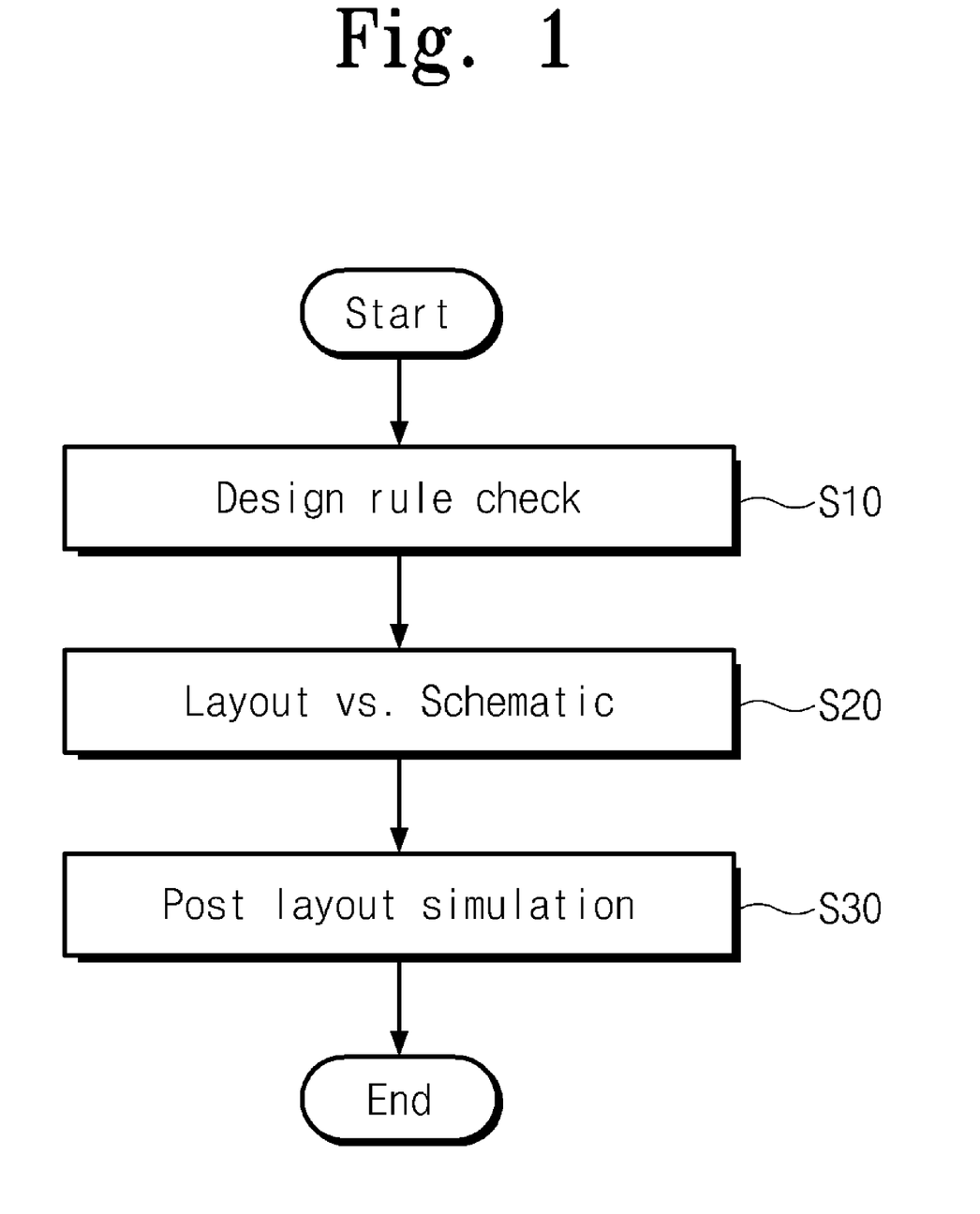
FIG. 1 is a flowchart of a general layout testing method.

FIG. 1 is a flowchart of a general layout testing method. Referring to FIG. 1, a general layout testing method is described as follows.

Operation S10 checks whether a designed product layout satisfies a design rule provided in a development stage. The design rule includes widths, lengths, pattern spacing and pattern overlap, etc. Operation S20 checks whether the product layout is equivalent to a designed circuit. Then, operation S30 checks whether circuit operation is normal according to the parasitic resistances or capacitors that occur while designing the product layout. Characteristics of the product layout are evaluated according to the results of circuit operation tests. As a result, weak points of the product layout can be detected, and the product layout can be corrected based on the detected weak points of the product layout. Therefore, a wafer is manufactured based on the corrected product layout.

In recent years, the semiconductor manufacturing process has been subdivided and chip size has been reduced. Thus, a product layout realized on a wafer may be distorted or different from the layout of the development stage. Thus, electrical characteristics of the transistor formed by the product layout may change or chip operation errors may occur. However, in the general layout testing method described above, these limitations may be undetected or uncorrected.

According to an embodiment of the inventive concept, layout parameters can be extracted from a product layout. The extracted layout parameters may be compared with designed layout parameters from the development stage to provide a layout testing method through which electrical characteristic changes resulting from layout changes may be detected and corrected. The layout parameters may be geometrical parameters related to transistor characteristics. For example, the layout parameters may include a contact volume, a distance from a gate pattern to a contact, a contact share ratio, a diffusion length, a space between separate active regions, a well proximity, a finger type, a gate pattern distortion, an active pattern distortion, a power line resistance, etc.

Figure 2:
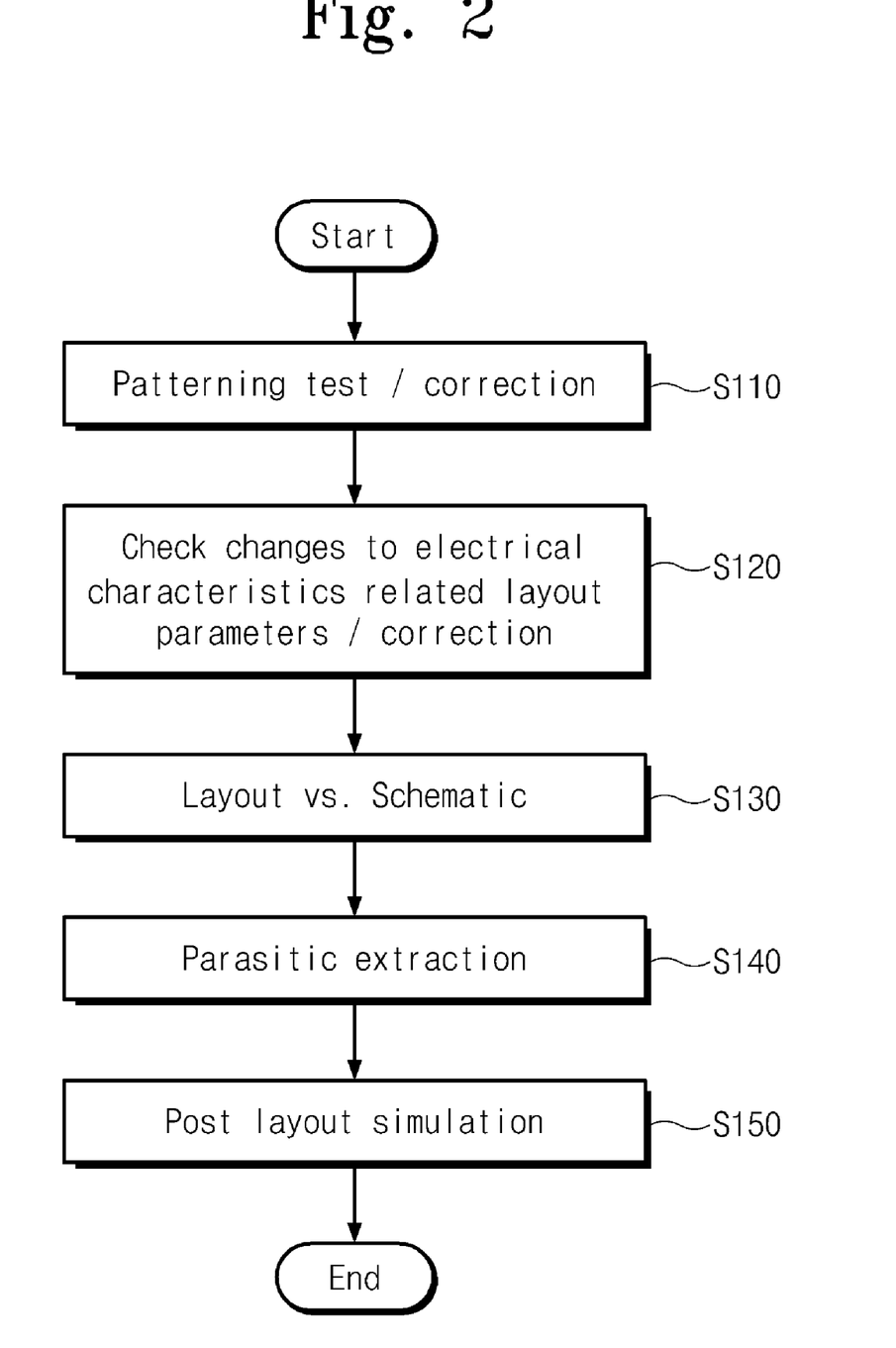
FIG. 2 is a flowchart of a layout testing method according to an embodiment of the inventive concept.

FIG. 2 is a flowchart of a layout testing method according to an embodiment of the inventive concept. Referring to FIG. 2, a layout testing method according to an embodiment of the inventive concept is described as follows.

In the development stage of a semiconductor device, model parameters for predicting circuit operation in a simulator (e.g., HSPICE) are extracted. The model parameters may include physical/structural parameters, which can be extracted by manufacturing a standardized test structure (e.g., hereinafter, referred to as "a test elements group (TEG)") on a wafer and measuring a plurality of electrical characteristics of the TEG on the wafer. The model parameters may include a channel length, a device width, a doping profile, an oxide thickness, an oxide permittivity, a channel length modulation constant, etc. The model parameters are input into the simulator (e.g., HSPICE). The operation of the designed circuit is verified through the simulator, and a product layout is designed that satisfies the design rule. The design rule is specified in the development stage of the semiconductor device.

Referring now to FIG. 2, in operation S110, the patterns of the designed product layout are checked and corrected. For example, the weak points of the product layout are detected through the pattern simulation. The product layout is corrected to eliminate the detected weak points. An optical proximity correction (OPC) technology may be applied to check and correct the patterns of the product layout. OPC technology can compensate for an optical proximity effect by predicting the image transferred onto the wafer or measuring an image of an actual test pattern, based on mask pattern information and wafer process conditions.

In operation S120, changes of the electrical characteristics of the layout parameters of the product layout are detected and corrected. First, the layout parameters are extracted from the product layout. The layout parameters may those geometrical or physical parameters which can cause electrical characteristics of the transistor to change.

By comparing the layout parameters extracted from the product layout with layout parameters of the TEG test wafer, electrical characteristic changes of the transistor may be detected. An electrical characteristic change model can be used to detect the electrical characteristic changes of the transistor. The electrical characteristic change model may be expressed as functions of differences between the layout parameters of the product layout and the layout parameters of the TEG, and is specified in the development stage of the semiconductor device. In the development stage of the semiconductor device, the layout parameters necessary for modeling are extracted from the layout of the TEG.

The differences between the layout parameters of the product layout and the layout parameters of the TEG are input into the simulator to detect the electrical characteristic changes according to the electric characteristic change model. When the detected electrical characteristic changes have values greater than predetermined threshold values, the product layout is corrected.

Operation S130 checks whether the product characteristics predicted from the product layout are equal to those predicted from a designed circuit view.

Then, in operation S140, parasitic components, such as the parasitic resistances and capacitances resulting from pattern distortion, are extracted.

Then, the extracted parasitic components are projected onto the circuit view, and a post layout simulation is performed in operation S150 to determine whether circuit operation is normal. The post layout simulation is performed using the model parameters previously input into the simulator. The model parameters include a channel length, a device width, a doping profile, an oxide thickness, an oxide permittivity, a channel length modulation constant, etc. A statistical distribution of the model parameter values can be predicted in the development stage of the semiconductor device.

In a layout testing method according to an embodiment of the inventive concept, the weak points of the layout with respect to the patterns may be detected and corrected, and the electrical characteristic changes of the layout parameters may be detected and corrected. In addition, it is checked whether circuit operation with respect to the parasitic components is normal.

Figure 3:
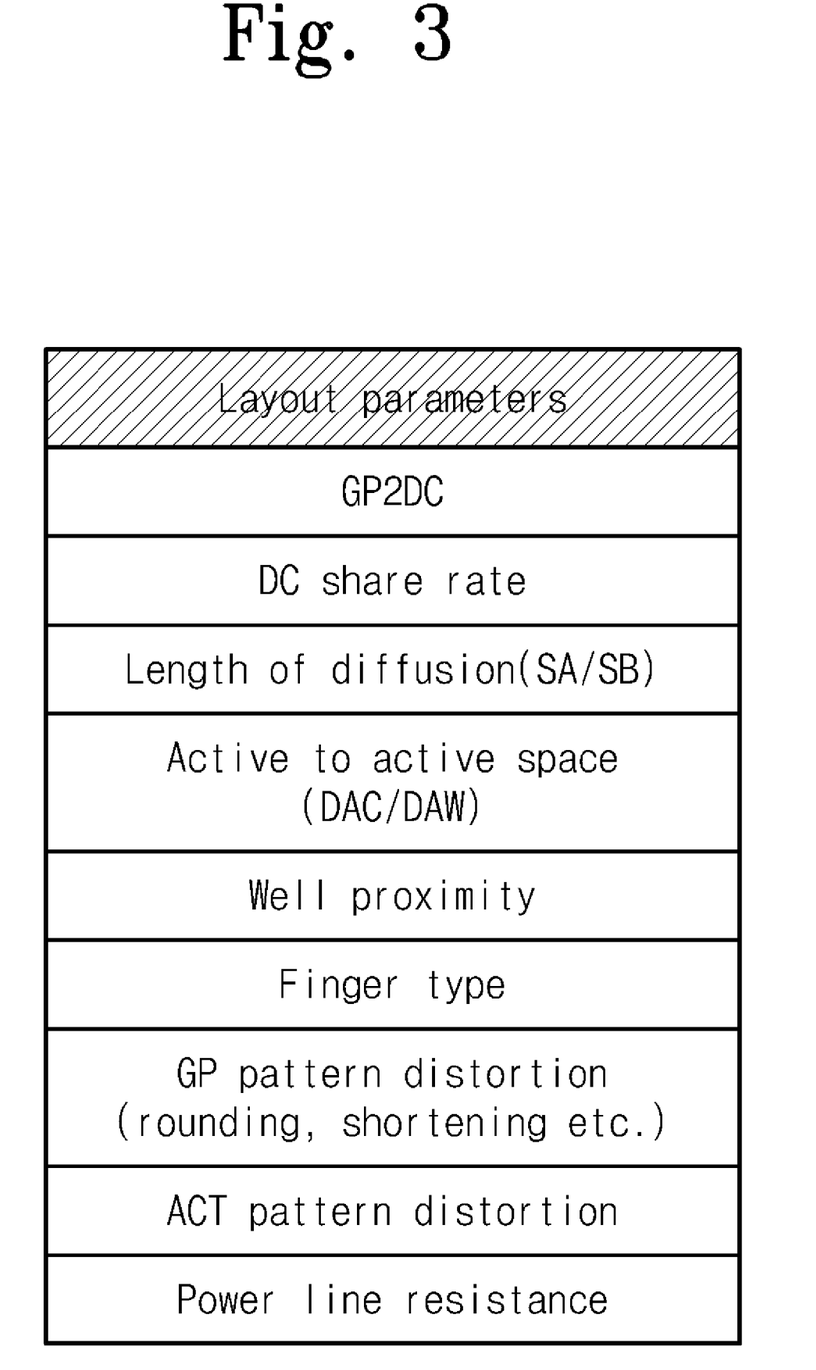
FIG. 3 is a view illustrating exemplary layout parameters according to an embodiment of the inventive concept.

FIG. 3 is a view illustrating exemplary layout parameters according to an embodiment of the inventive concept. Referring to FIG. 3, layout parameters include a distance from a gate pattern to a contact (GP2DC), a contact share ratio (DC share rate), a diffusion length (SA/SB), a space between separate active regions (active to active space (DAC/DAW)), a well proximity, a finger type, a gate pattern distortion (GP pattern distortion), an active pattern distortion (ACT pattern distortion), a power line resistance, etc. The well proximity is a distance from a well to an adjacent well, and the gate pattern distortion occurs due to rounding or shortening.

Figure 4:
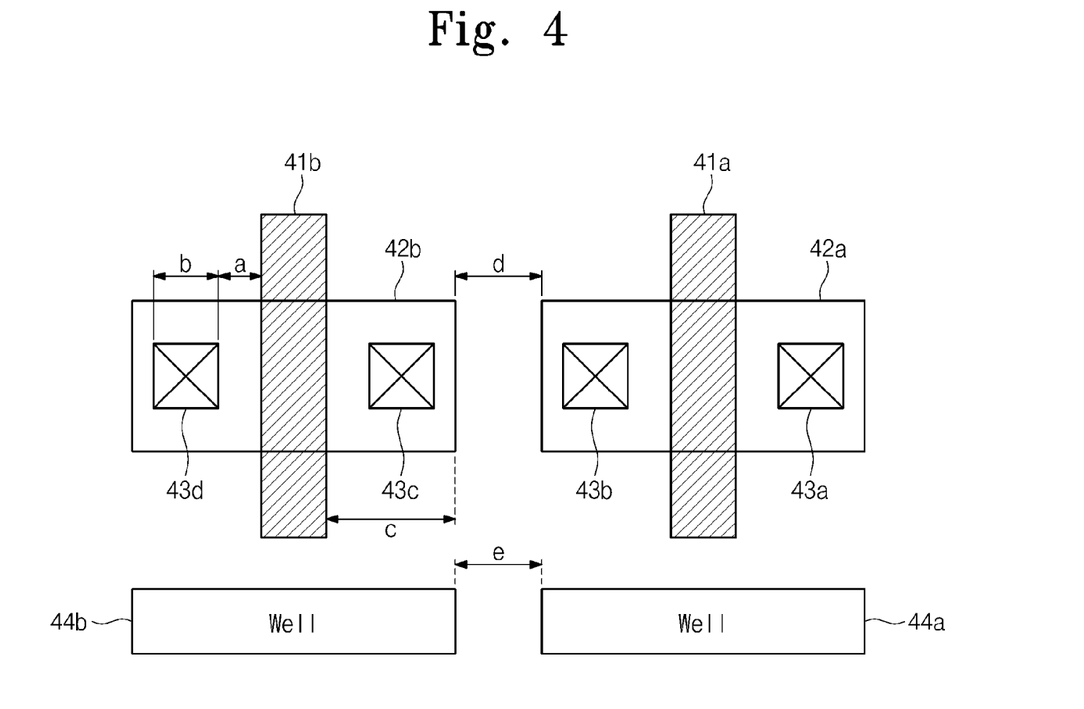
FIG. 4 is a schematic view illustrating the layout parameters of FIG. 3.

FIG. 4 is a schematic view illustrating the layout parameters of FIG. 3. FIG. 4 shows a schematic layout pattern having wells 44a and 44b, and contacts 43a, 43b, 43c, and 43d. The objects 41a, 41b and 42a, 42b are contacts for connecting to metal lines. Referring to FIG. 4, the distance from the gate pattern to the contact is indicated by reference symbol "a", contact length is indicated by reference symbol "b", and a length from the gate pattern to the active region is indicated by reference symbol "c". The contact share ratio is "b/c" (not shown), the space between separate active regions is indicated by reference symbol "d", and the well proximity is indicated by reference symbol "e".

In a layout testing method shown in FIGS. 2 to 4, the parasitic components are extracted, and the extracted parasitic components are projected onto the circuit view to perfoiui the simulation. However, in a layout testing method according to other embodiments of the inventive concept, it is no longer necessary to extract the parasitic components. A layout testing method according to another embodiment of the inventive concept need not include extracting the parasitic components from the product layout.

Figure 5:
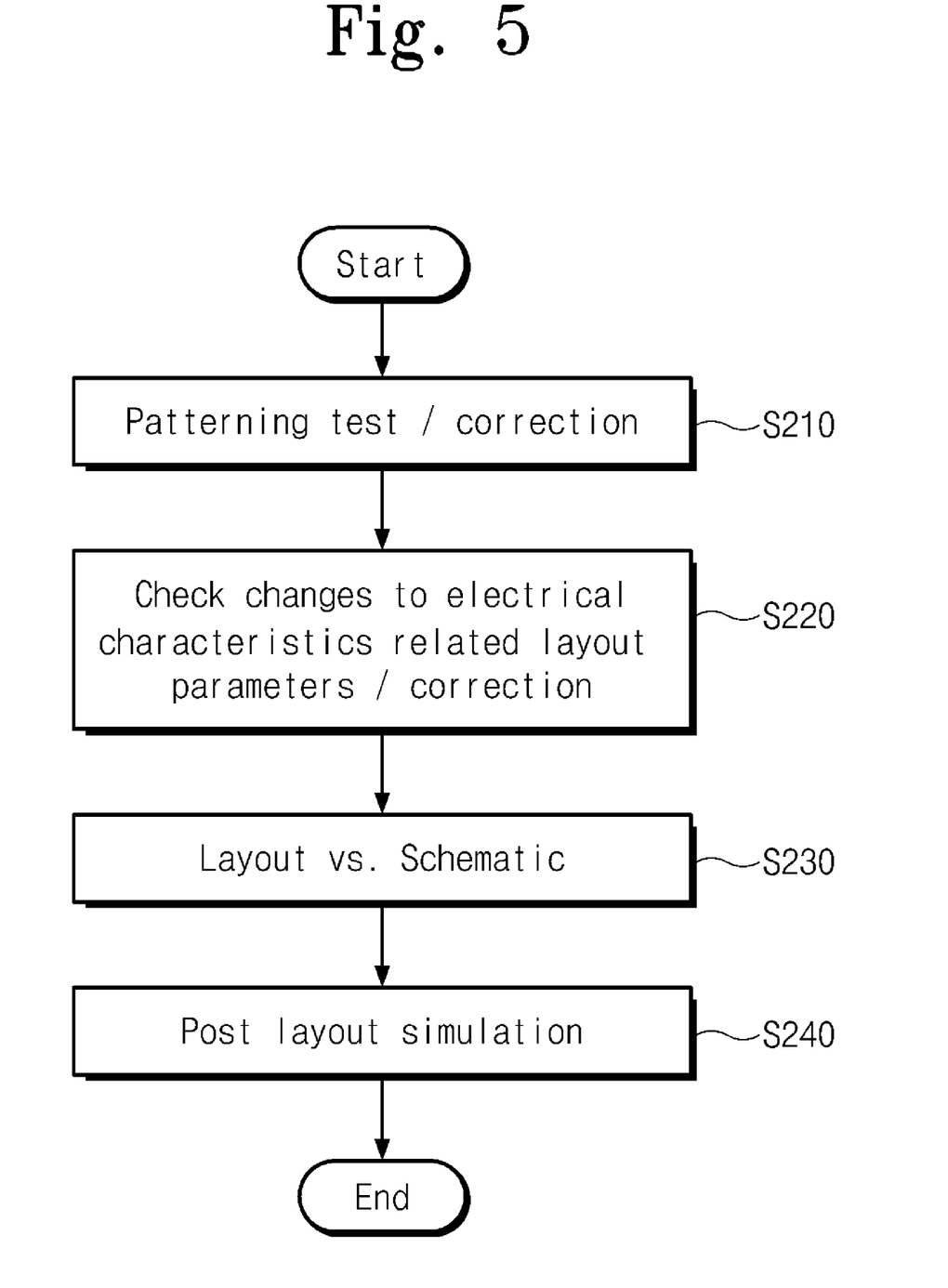
FIG. 5 is a flowchart of a layout testing method according to another embodiment of the inventive concept.

FIG. 5 is a flowchart of a layout testing method according to another embodiment of the inventive concept. Referring to FIG. 5, a layout testing method according to the inventive concept is described as follows.

In operation S210, product layout patterns are checked and corrected. In operation S220, electrical characteristic changes with respect to product layout parameters are detected and corrected. Operation S230 checks whether product characteristics predicted from the product layout are equal to those predicted from a designed circuit view. In operation S240, a post layout simulation is performed with respect to the corrected product layout to check whether circuit operation is normal.

In a layout testing method according to an embodiment of the inventive concept, weak points of the layout with respect to the patterns may be detected and corrected, and the electrical characteristic changes of the layout parameters may be detected and corrected.

In a layout testing method shown in FIGS. 2 to 5, the weak points of the layout with respect to the patterns are detected and corrected. However, a layout testing method according to an embodiment of the inventive concept is not necessarily limited thereto. A layout testing method according to an embodiment of the inventive concept may check whether the product layout satisfies a design rule.

Figure 6:
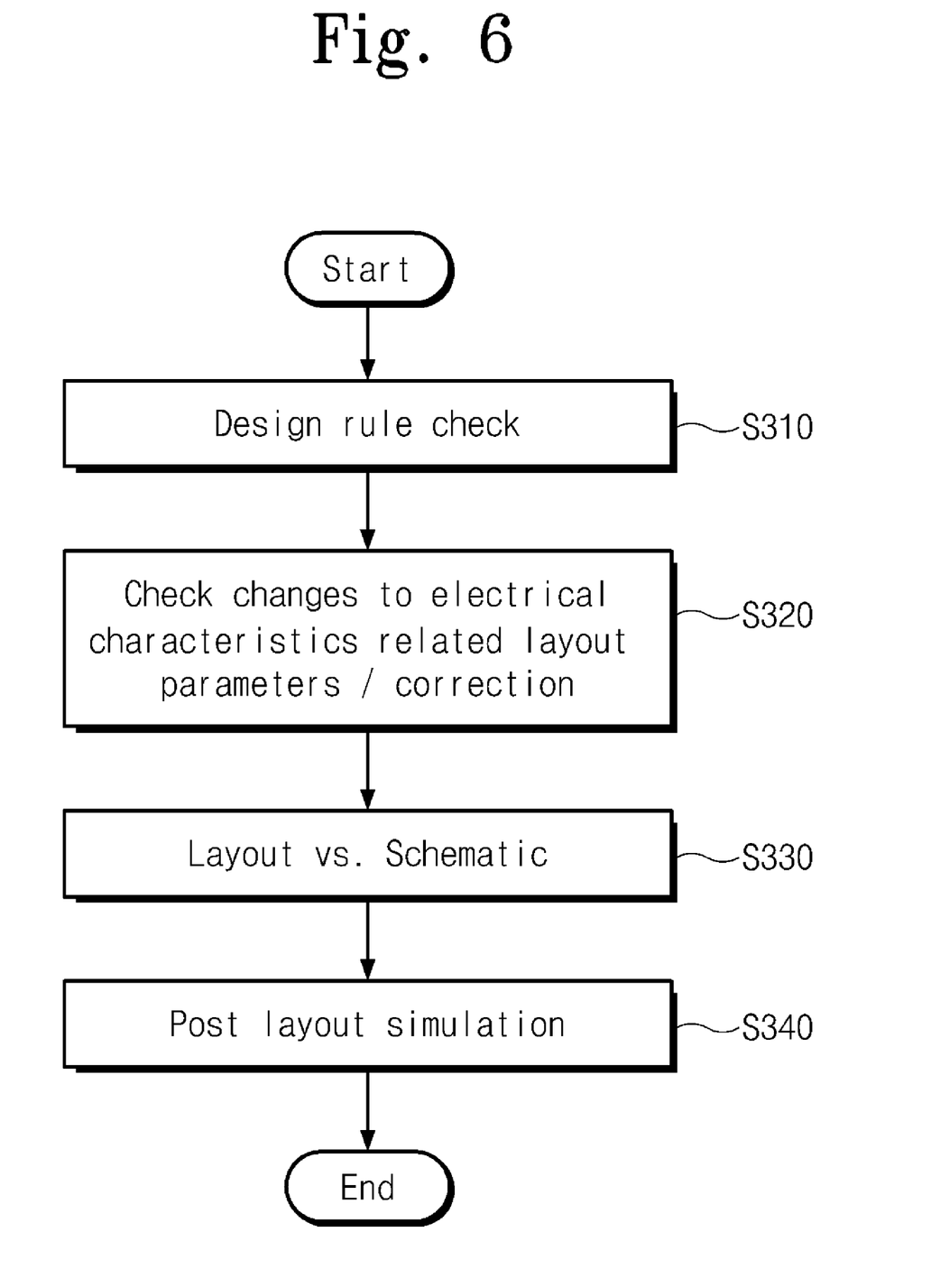
FIG. 6 is a flowchart of a layout testing method according to another embodiment of the inventive concept.

FIG. 6 is a flowchart of a layout testing method according to another embodiment of the inventive concept. Referring to FIG. 6, a layout testing method according to the inventive concept is described as follows.

Operation S310 checks whether a product layout satisfies a design rule. In operation S320, electrical characteristic changes with respect to the product layout parameters are detected and corrected. Operation S330 checks whether product characteristics predicted from the product layout are equal to those predicted from a designed circuit view. In operation S340, a post layout simulation is performed with respect to the corrected product layout to check whether the circuit operation is normal.

In a layout testing method according to an embodiment of the inventive concept, the electrical characteristic changes of the layout parameters may be detected and corrected.

Figure 7:
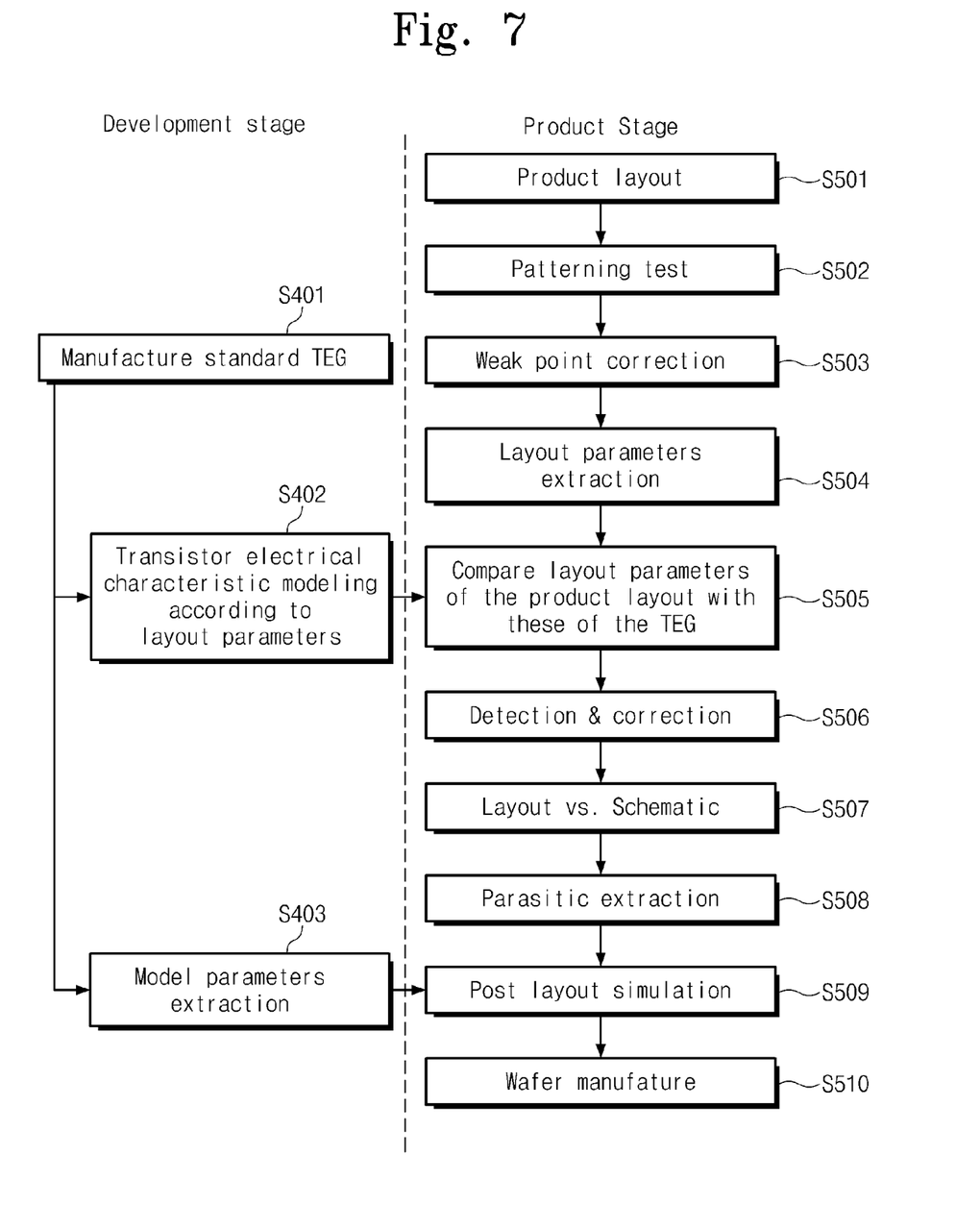
FIG. 7 is a flowchart illustrating a wafer manufacturing method of a semiconductor device according to an embodiment of the inventive concept.

FIG. 7 is a flowchart illustrating a wafer manufacturing method of a semiconductor device according to an embodiment of the inventive concept. Referring to FIG. 7, a wafer manufacturing method of a semiconductor device may be classified into a development stage and a product stage.

In the development stage, at least one TEG wafer is manufactured in operation S401, electrical characteristics of a transistor's layout parameters are modeled from a TEG layout for the manufactured TEG wafer in operation S402, and a plurality of electrical characteristics of the manufactured TEG wafer are detected in operation 403 to extract model parameters. Here, the TEG wafer refers to a wafer having only a TEG formed thereon.

The electrical characteristic model may be presented as a table, expressed as a regression equation, or realized as a circuit simulation. When a difference between the layout parameters is above a predetermined value, a table may list the corresponding layout parameter corrections. A regression equation is a numerical formula for the correction of the layout parameters as a function of the difference between the layout parameters. A circuit simulation calculates layout parameter corrections when the difference between the layout parameters is input.

The product stage progresses as follows. In operation S501, a designer designs a product layout that satisfies a design rule. Operation S502 checks patterns of the designed product layout. In operation S503, weak points according to the patterning test are corrected.

In operation S504, layout parameters of each transistor of the product layout are extracted. Then, in operation S505, the extracted layout parameters are compared with TEG layout parameters provided from the development stage operation S402. The electrical characteristic model of the transistor is used to detect electrical characteristics depending on a difference between the layout parameters of the product layout and the TEG layout parameters. As a result, the product layout is corrected in operation S506. In particular, according to an embodiment of the inventive concept, electrical characteristics of whole transistors of the product layout may be detected and corrected.

Operation S507 checks whether the corrected product layout is equivalent to the circuit view. Then, in operation S508, parasitic components of the layout are extracted. In operation S509, a post layout simulation is performed in which the extracted parasitic components are projected onto the circuit view to confirm whether circuit operation is normal. The model parameters of the post layout simulation are provided from the development stage operation S403.

If the operation of the circuit is normal, mask pattern and wafer manufacturing processes are performed based on the corrected production layout in operation S510.

In a wafer manufacturing method according to an embodiment of the inventive concept, the electrical characteristic changes of the layout parameters are modeled in the development stage, and the layout parameters of each transistor are extracted in the product stage. The extracted layout parameters are compared with the TEG layout parameters to detect and correct the electrical characteristic changes.

Figure 8:
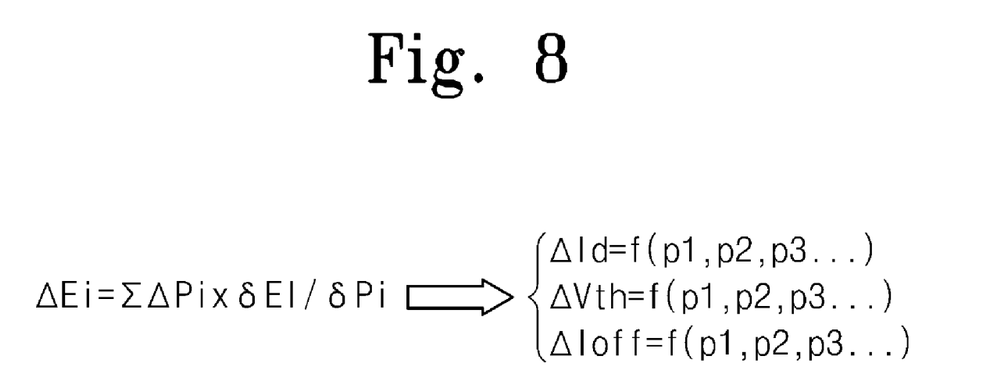
FIG. 8 is a view illustrating electrical characteristic modeling of a transistor according to layout parameters in a development stage, according to an embodiment of the inventive concept.

FIG. 8 is a view illustrating electrical characteristic modeling of a transistor according to layout parameters in a development stage, according to an embodiment of the inventive concept. Referring to FIG. 8, electrical characteristic changes $\Delta$ Ei of a transistor are expressed as the sum of a difference $\Delta$Pi between TEG layout parameters and product layout parameters and a standard deviation $\delta$El of the electrical characteristic changes divided by a standard deviation $\delta$Pi of the layout parameters.

For example, a characteristic change model of a transistor due to a contact size of a source/drain of the layout parameters is illustrated. The electrical characteristic changes Id, Vth, and Ioff of the transistor with respect to each of the layout parameters p1, p2, p3, . . . , may be expressed as follows. That is, the driving current Id, the threshold voltage Vth, and the leakage current Ioff are expressed as functions of the layout parameters p1, p2, p3, . . . .

Figure 9:
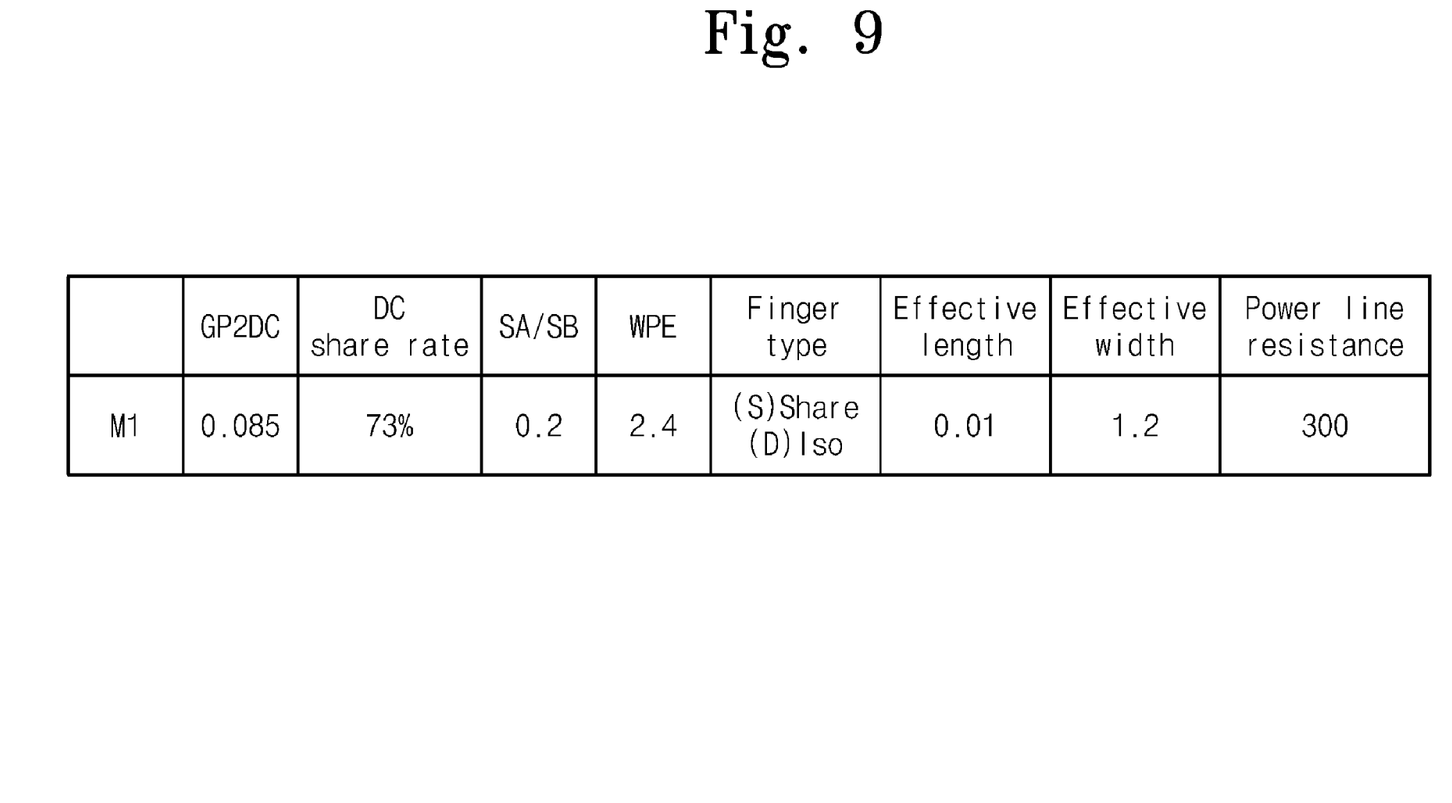
FIG. 9 is a table illustrating exemplary layout parameters extracted from a layout in a product stage according to an embodiment of the inventive concept.

FIG. 9 is a table illustrating exemplary layout parameters extracted from a layout in a product stage, according to an embodiment of the inventive concept. Referring to FIG. 9, a distance from a gate pattern to a contact (GP2DC) is about 0.085, a contact share ratio (DC share rate) is about 73%, and a diffusion distance (SA/SB) is about 0.2, a well proximity (WPE) is about 2.4. A finger type is shared (S) or isolated (D). In addition, an effective distance (Effective length) is about 0.01, an effective width is about 1.2, and a power line resistance is about 300 ohm.

Figure 10:
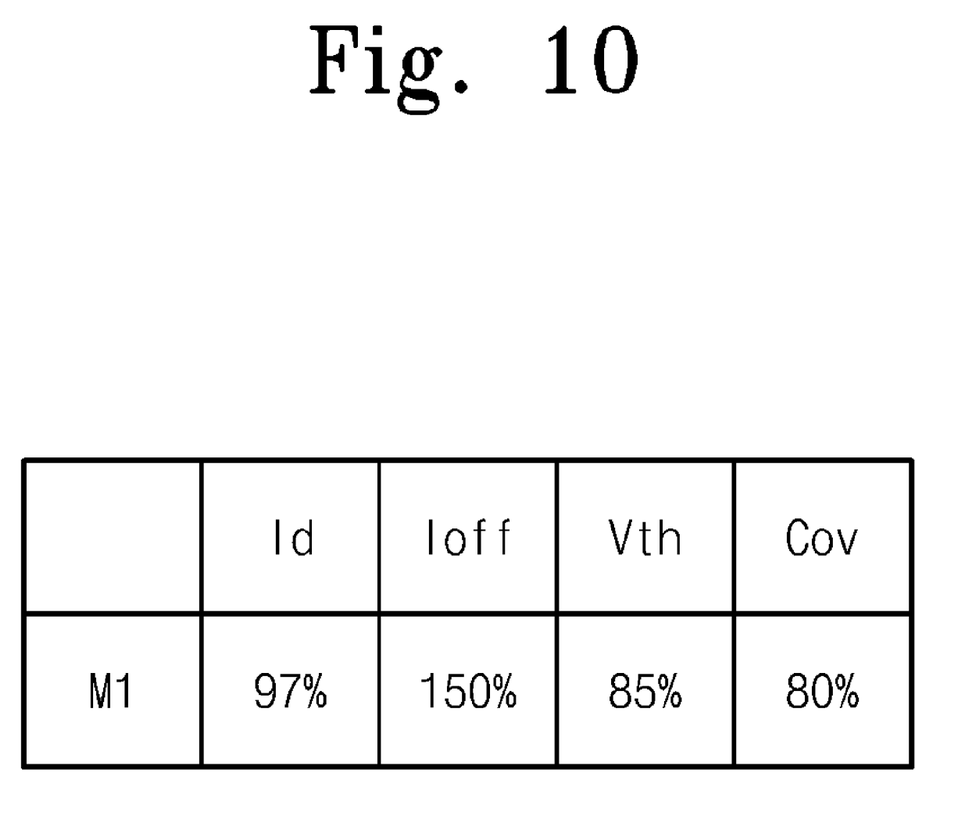
FIG. 10 is a table illustrating exemplary electrical characteristic comparison values from transistors in development and product stages, according to an embodiment of the inventive concept.

FIG. 10 is a table illustrating exemplary electrical characteristic comparison values of a transistor M1 in a product stage with a transistor of a TEG in the development stage, according to an embodiment of the inventive concept. Referring to FIG. 10, driving current Id of transistor M1 is reduced to about 97%, the leakage current Ioff of transistor M1 is increased to about 150%, the threshold voltage Vth of transistor M1 is reduced to about 85%, and a parasitic capacitance Coy of transistor M1 is reduced to about 80%. The parasitic capacitance Cov depends on the results of the post layout simulation (see operation S509 of FIG. 7)

Thus, it may be determined whether the product layout has been corrected according to the electrical characteristic changes. For example, the electrical characteristic change model may be used when the driving current Id is increased by about 10%.

Also, the electrical characteristic change model need not be used in case of a transistor for which the effects of characteristics of different layout parameters offset each other. For example, when the increase of the contact share ratio increases the driving current Id of the transistor, but the increase of the power line resistance reduces the driving current Id, it is not necessary to correct the product layout of the transistor.

In a layout testing method according to an embodiment of the inventive concept, the electrical characteristic changes are detected and corrected using the layout parameters to increase predication when the designed product layout is realized onto an actual wafer. Therefore, in a layout testing method according to an embodiment of the inventive concept, product errors may be previously detected and chip malfunction may be prevented.

In addition, electrical characteristic changes may be detected for units of transistors to more quickly verify the layout.

As described above, in a layout testing method and a wafer manufacturing method according to an embodiment of the inventive concept, weak points of the layout with respect to the patterns may be detected and corrected. In addition, electrical characteristic changes of the layout parameters may be detected and corrected, and it may be checked whether circuit operation depending on the parasitic components is normal.

The above-disclosed subject matter is to be considered illustrative and not restrictive, and the appended claims are intended to cover all such modifications, enhancements, and other embodiments, which fall within the true spirit and scope of the embodiments of the inventive concept. Thus, to the maximum extent allowed by law, the scope of the embodiments of the inventive concept is to be determined by the broadest permissible interpretation of the following claims and their equivalents, and shall not be otherwise restricted or limited by the foregoing detailed description.

What is claimed is:

1. A layout testing method comprising:
   detecting weak points of a designed product layout using a pattern simulator executed by a computer;
   correcting the weak points of said product layout, creating a corrected product layout;
   comparing layout parameters of the corrected product layout with layout parameters of a test wafer to detect electrical characteristic changes of transistors of the product layout,
   wherein differences between the layout parameters of the product layout and the layout parameters of the test wafer are input into a circuit simulator executed by a computer to detect the electrical characteristic changes according to an electric characteristic change model expressed as functions of differences between the layout parameters of the product layout and the layout parameters of the test wafer; and
   if the detected electrical characteristic changes have values greater than predetermined threshold values, correcting the product layout.

2. The layout testing method of claim 1, further comprising extracting the layout parameters of the product layout, before comparing with the layout parameters of the test wafer.

3. The layout testing method of claim 2, wherein the extracted layout parameters comprise at least one of a contact volume, a distance from a gate pattern to a contact, a contact share ratio, a diffusion length, a distance between separate active regions, a well proximity, a finger type, a gate pattern distortion, an active pattern distortion, and a power line resistance.

4. The layout testing method of claim 1, further comprising:
   checking whether product characteristics predicted from the product layout are equal to those predicted from a designed circuit view; and
   performing a post layout simulation to check whether an operation of the designed circuit is normal.

5. The layout testing method of claim 4, further comprising extracting parasitic components resulting from pattern distortion before performing the post layout simulation.

6. The layout testing method of claim 5, wherein the extracted parasitic components are projected onto the designed circuit view to perform the post layout simulation.

7. The layout testing method of claim 4, further comprising using model parameters in the post layout simulation, wherein the model parameters comprise a channel length, a device width, a doping profile, an oxide thickness, an oxide permittivity, and a channel length modulation constant.

8. The layout testing method of claim 1, wherein detecting weak points of the designed product layout further comprises using an optical proximity correction (OPC) technology to check and correct the patterns of the product layout.

9. A wafer manufacturing method comprising:
   manufacturing at least one test wafer;
   modeling on a computer electrical characteristic changes of a transistor's layout parameters of the at least one test wafer using an electrical characteristics model; and
   detecting a plurality of electrical characteristics of the at least one test wafer from model parameters of the test wafer.

10. The wafer manufacturing method of claim 9, further comprising:
    designing a product layout that satisfies a design rule;
    testing and correcting one or more patterns of the product layout;
    extracting layout parameters of each transistor of the product layout;
    comparing the extracted layout parameters with the detected electrical characteristics extracted from the test wafer to detect and correct electrical characteristic changes of the transistors of the product layout;
    checking whether the corrected product layout is equivalent to that predicted from a designed circuit view;
    performing a post layout simulation using the detected electrical characteristics extracted from the test wafer; and
    manufacturing a wafer according to the corrected product layout.

11. The wafer manufacturing method of claim 10, further comprising extracting parasitic resistance and capacitance resulting from pattern distortion and projecting the extracted parasitic resistance and capacitance onto the designed circuit view before performing the post layout simulation.

12. The wafer manufacturing method of claim 10, wherein the electrical characteristics model is used to compare the extracted layout parameters with the layout parameters extracted from the test wafer.

13. The wafer manufacturing method of claim 10, wherein testing and correcting of said one or more patterns comprises using an optical proximity correction (OPC) technology.

14. The wafer manufacturing method of claim 10, wherein manufacturing a wafer comprises manufacturing a mask pattern according to the corrected product layout.

15. The wafer manufacturing method of claim 9, wherein the electrical characteristic model is one of a table, a regression equation, or a circuit simulation, wherein when a difference between the layout parameters is above a predetermined value, said table lists the corresponding layout parameter corrections, said regression equation is a numerical formula for the correction of the layout parameters as a function of the difference between the layout parameters, and said circuit simulation calculates layout parameter corrections based on the differences between the layout parameters.

16. A layout testing method comprising:

checking whether a designed product layout satisfies a design rule;

detecting and correcting electrical characteristic changes of product layout parameters of the designed product layout to generate a corrected product layout;

checking whether product characteristics predicted from the product layout are equal to those predicted from a designed circuit view; and performing a post layout simulation on a computer with respect to the corrected product layout to check whether circuit operation is normal.

17. The layout testing method of claim 16, wherein the design rule comprises widths, lengths, and pattern spacings or pattern overlaps.

18. The layout testing method of claim 16, wherein detecting and correcting electrical characteristic changes comprise checking electrical characteristic changes of transistors of the product layout.

19. The layout testing method of claim 18, wherein, when the electrical characteristic changes of the transistors of the product layout exceed predetermined values, the product layout is corrected.

20. The layout testing method of claim 16, wherein the post layout simulation is performed by a circuit operation simulator according to an electrical characteristic change model using model parameters extracted from a test wafer.

* * * * *